(12) United States Patent
Caruba et al.

(10) Patent No.: US 9,134,392 B2
(45) Date of Patent: Sep. 15, 2015

(54) DUAL IMAGING ACQUISITION USING COMMON TIME-BASE FREQUENCY

(75) Inventors: James Frank Caruba, Bartlett, IL (US); Ralf Ladebeck, Erlangen (DE); Ralph Oppelt, Uttenreuth (DE); Patanit Sanpitak, Highland Park (IL)

(73) Assignees: Siemens Medical Solutions USA, Inc., Malvern, PA (US); Siemens Aktiengesellschaft, Munich (DE)

( * ) Notice: Subject to any disclaimer, the term of this patent is extended or adjusted under 35 U.S.C. 154(b) by 829 days.

(21) Appl. No.: 12/902,185

(22) Filed: Oct. 12, 2010

(65) Prior Publication Data

US 2012/0089007 A1    Apr. 12, 2012

(51) Int. Cl.
*A61B 6/00* (2006.01)
*G01R 33/48* (2006.01)

(52) U.S. Cl.
CPC .................................. *G01R 33/481* (2013.01)

(58) Field of Classification Search
None
See application file for complete search history.

(56) References Cited

U.S. PATENT DOCUMENTS

| | | | | |
|---|---|---|---|---|
| 5,546,001 A | * | 8/1996 | Miura | 324/322 |
| 2006/0058683 A1 | * | 3/2006 | Chance | 600/476 |
| 2008/0284428 A1 | * | 11/2008 | Fiedler et al. | 324/307 |
| 2010/0030068 A1 | * | 2/2010 | Vaillant et al. | 600/426 |

* cited by examiner

*Primary Examiner* — Unsu Jung
*Assistant Examiner* — Michael N Fisher
(74) *Attorney, Agent, or Firm* — Peter Kendall

(57) ABSTRACT

Timing in a medical imaging system. The system comprises a magnetic resonance imaging (MRI) subsystem and a non-MRI subsystem. Operation of the non-MRI subsystem involves a timing signal within a radio frequency (RF) cabin of the MRI subsystem. Basing each non-MRI subsystem timing signal on a time base common between the MRI subsystem and the non-MRI subsystem. The non-MRI subsystem can be a medical imaging subsystem. The non-MRI medical imaging subsystem can be a positron emission tomography (PET) subsystem. Each non-MRI subsystem timing signal that based on the common time base can be created using the same model of equipment used for creating timing signals in the MRI subsystem. At least one stage of the non-MRI subsystem timing signal based on the common time base can be created using the same equipment used for creating timing signals in the MRI subsystem.

18 Claims, 4 Drawing Sheets

DUAL IMAGING ACQUISITION USING COMMON TIME-BASE FREQUENCY

FIELD

The technology disclosed herein (the "technology") relates to, inter alia, imaging systems, and, in particular, to hybrid imaging system such as combined Positron Emission Tomography (PET) imaging and Magnetic Resonance Imaging (MRI) systems, and methods of interoperability of such combined imaging systems without interference.

BRIEF DESCRIPTION OF THE DRAWINGS

Reference will now be made, by way of example, to the accompanying drawings which show example implementations of the present application.

DETAILED DESCRIPTION

Reference will now be made in detail to implementations of the technology. Each example is provided by way of explanation of the technology only, not as a limitation of the technology. It will be apparent to those skilled in the art that various modifications and variations can be made in the present technology without departing from the scope or spirit of the technology. For instance, features described as part of one implementation can be used on another implementation to yield a still further implementation. Thus, it is intended that the present technology cover such modifications and variations that come within the scope of the technology.

Medical imaging technology may be used to create images of the human body for clinical purposes (e.g., medical procedures seeking to reveal, diagnose or examine disease) or medical science (including the study of normal anatomy and physiology). Medical imaging technology includes: radiography including x-rays, fluoroscopy, and x-ray computed axial tomography (CAT or CT); magnetic resonance imaging (MRI); and nuclear medical imaging such as scintigraphy using a gamma camera, single photon emission computed tomography (SPECT), and positron emission tomography (PET).

In nuclear medicine imaging, radiopharmaceuticals are taken internally, for example intravenously or orally. Then, external systems capture data from the radiation emitted, directly or indirectly, by the radiopharmaceuticals; and then form images from the data. This process is unlike a diagnostic X-ray where external radiation is passed through the body and captured to form an image.

Figure 1:
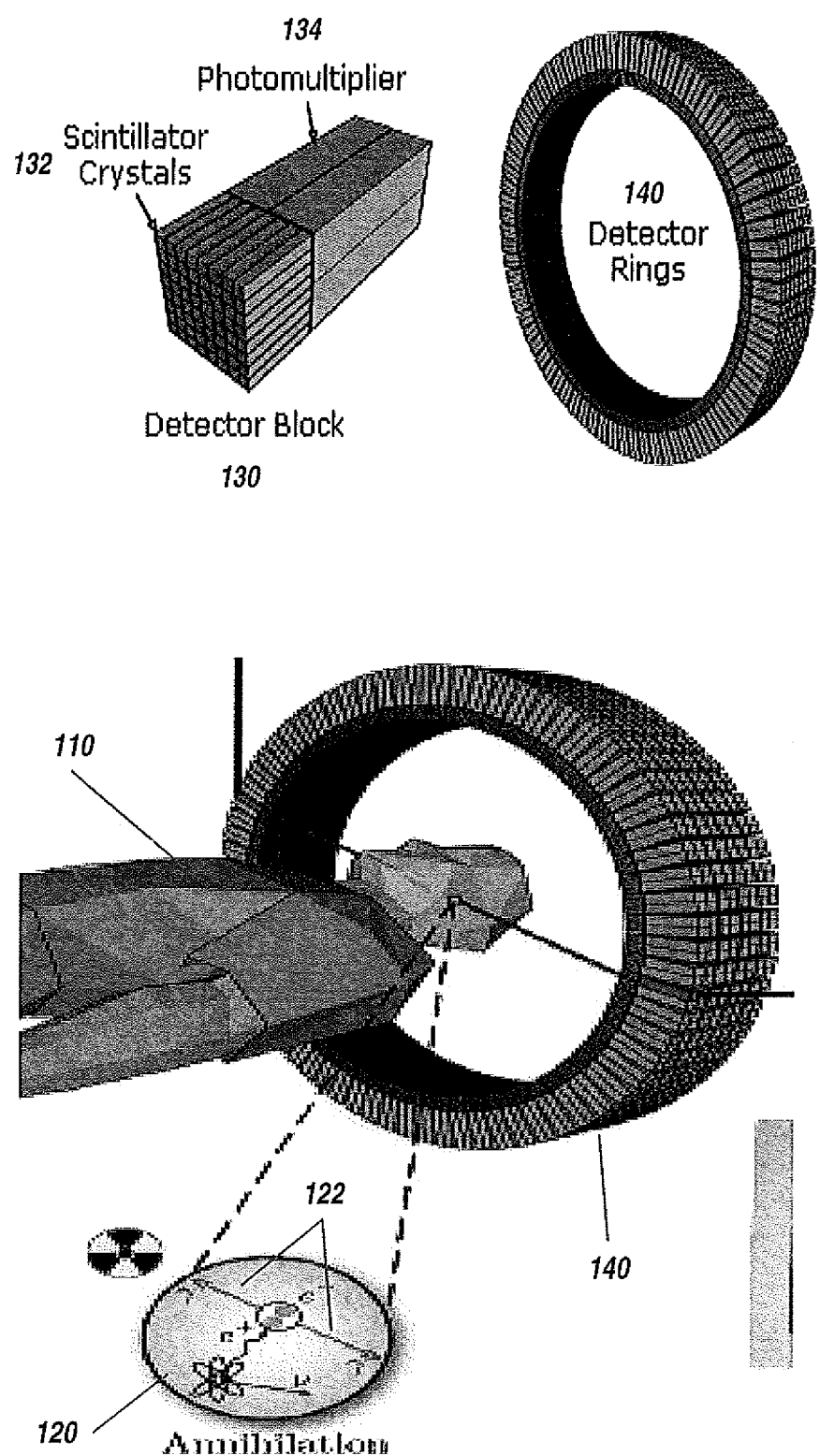
FIG. 1 illustrates a portion of an architecture for a positron emission tomography (PET) medical imaging device.

Referring to FIG. 1, in PET, a short-lived radioactive tracer isotope is injected or ingested into the subject 110. As the radioisotope undergoes positron emission decay 120 (also known as positive beta decay), it emits a positron, an antiparticle of the electron with opposite charge. The emitted positron travels in tissue for a short distance, during which time it loses kinetic energy, until it decelerates to a point where it can interact with an electron. The encounter annihilates both electron and positron, producing a pair of annihilation (gamma) photons 122 moving in approximately opposite directions. These are detected when they reach a scintillator 132 in the scanning device, creating a burst of light which is detected by photomultiplier tubes 134 or silicon avalanche photodiodes (Si APD). The PET detector blocks 130 are typically fixed in a detector ring 140.

Magnetic resonance imaging (MRI) is primarily a noninvasive medical imaging technique used in radiology to visualize detailed internal structure and limited function of the body. MRI provides greater contrast between the different soft tissues of the body than computed tomography (CT) does, making it especially useful in neurological (brain), musculoskeletal, cardiovascular, and ontological (cancer) imaging. Unlike CT, MRI uses no ionizing radiation. Rather, it uses a powerful magnetic field to align the nuclear magnetization of (usually) hydrogen atoms in water in the body. Radio frequency (RF) fields are used to systematically alter the alignment of this magnetization. This causes the hydrogen nuclei to produce a rotating magnetic field detectable by the scanner. This signal can be manipulated by additional magnetic fields to build up enough information to construct an image of the body.

In medical imaging so-called "hybrid modalities" are becoming increasingly important, for example PET-CT, SPECT-CT, PET-MRI and SPECT-MRI. One potential advantage of these combinations is the connection of a modality with a high local resolution (especially MRI or CT) to a modality with high sensitivity (especially SPECT or PET). In particular, while PET-MRI can present imaging advantages, simultaneous operation of PET and MRI subsystems also presents an interoperability risk to the MRI subsystem if the PET subsystem performs digital sampling and data processing where those activities can interfere with the MRI receivers at the spin frequencies of the MRI subsystem, e.g., 123.212 MHz for 3 T Hydrogen. For example, RF signals (either directly, or mixed with other signals) from the clocks used in PET sampling and data processing can interfere with MRI receivers. Some PET-MRI designs place PET detector blocks inside the MRI RF cabin, but conduct PET digital sampling and data processing behind shielding and filters at some distance, e.g., 15 m from the MRI RF cabin. However, it is desirable to place the PET digital sampling and data processing equipment such that interconnect distance between the PET detectors and PET digital sampling and data processing equipment is minimized.

In implementations of the present technology PET detectors are places in the MRI RF cabin, along with PET digital sampling and data processing resources. The PET and MRI subsystems are driven by a common clock source to reduce the likelihood that PET digital sampling and data processing will interfere with MRI subsystem operation.

Figure 2:
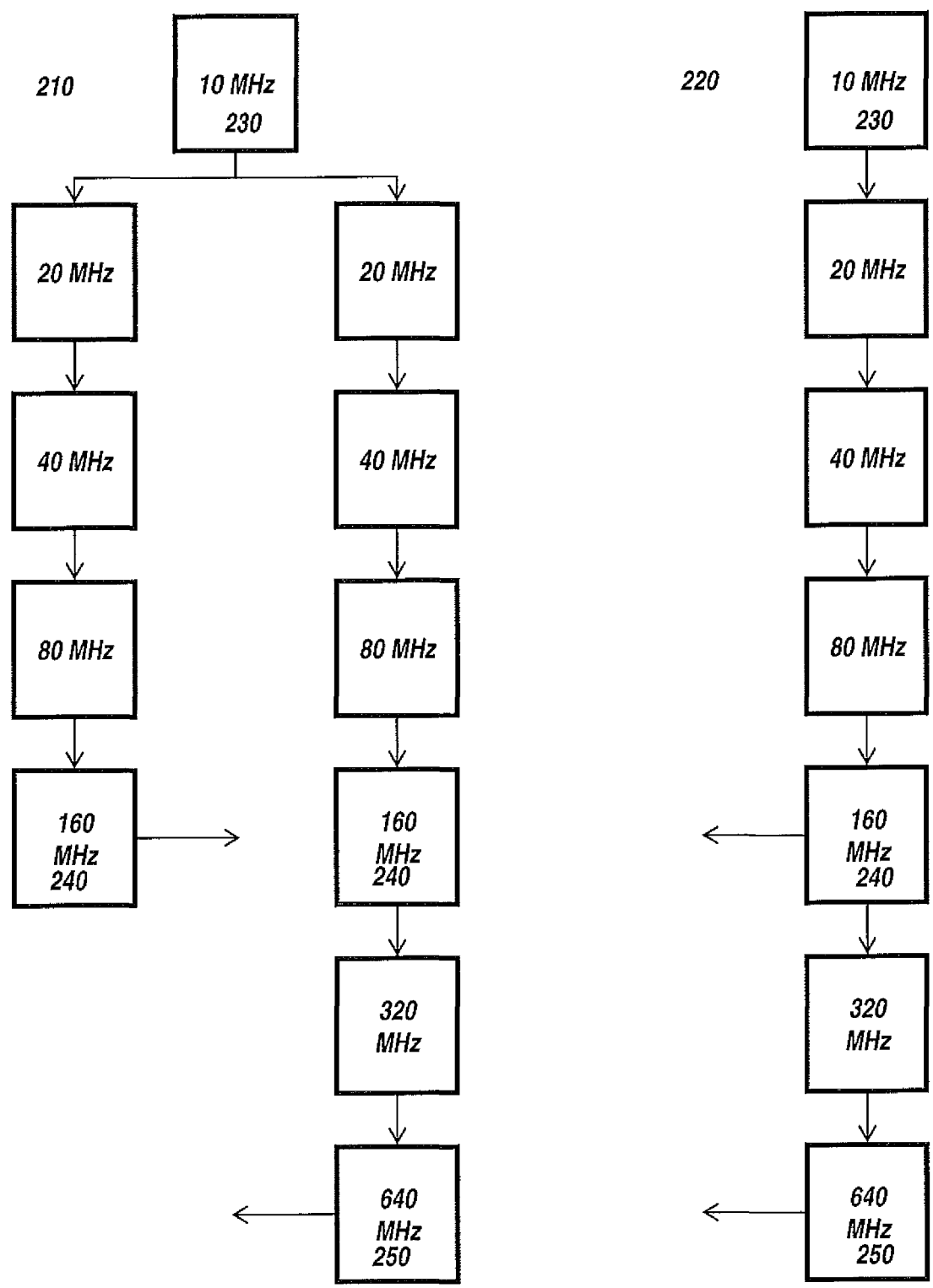
FIG. 2 illustrates timing ladders that can be used in implementation of the present technology.

Referring to FIG. 2, two notional timing ladders 210 220 for a PET-MRI system are shown. In some implementations the MRI subsystem includes a 10 MHz oscillator 230, e.g., an oven-controlled crystal oscillator (OCXO), as a time base. Doubler circuits divide the 10 MHz signal in half in stages to produce 20 MHz, 40 MHz, 80 MHz, 160 MHz 240, 320 MHz, and 640 MHz 250 phase locked signals. In ladder 210 a power splitter (not shown explicitly) is used before doubling to 20 MHz. The 640 MHz signal 250 can be used by the MRI subsystem to control RF pulsing. The 160 MHz signal 240 can be used by the PET subsystem to perform digital sampling (including conversion of the analog signal from PET detectors to sampled digital signals). In each ladder, successive doublings can be kept in phase lock.

In implementations where PET subsystem timing is based on a common time clock with the MRI subsystem, but derived separately, the PET subsystem timing can be derived using the same equipment as MRI subsystem timing uses.

In an illustrative example, twenty eight (28) PET data acquisition units (DAUs), containing analog-to-digital converters and digital communication equipment, were mounted at the back of an MRI subsystem and connected to 56 PET detector blocks—two (2) detector blocks per DAU—located within the MRI bore in front of the gradient coil and behind the body coil RF screen. In a baseline test with no PET DAUs and no PET detectors the mean noise measured across the 500 kHz operating band of the MRI subsystem was 520.08 mean MR image pixel amplitude (in a 10 KHz wide frame—frequency x, phase y, amplitude (pixel) image. With the introduction of operating DAUs driven by a time base common to the MRI subsystem and connected to PET detectors in the MRI bore via cables, the mean noise measured across the 500 kHz operating band of the MRI subsystem was 520.10 mean MR image pixel amplitude; presenting no meaningful interference.

Figure 3:
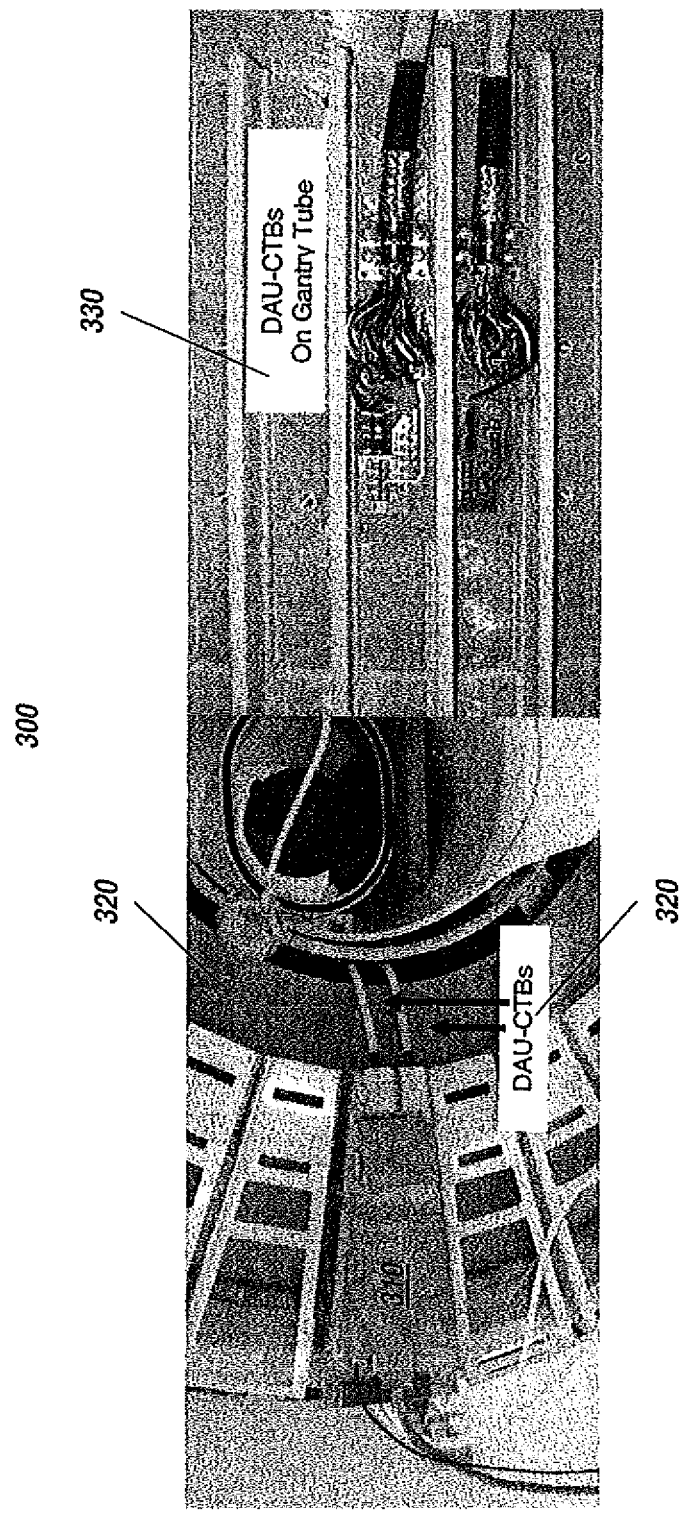
FIG. 3 illustrates a PET data acquisition unit mounted to the back of a Magnetic Resonance Imaging (MRI) subsystem.

Referring to FIG. 3, a portion 300 of such a system is shown. One DAU 310 is shown mounted at the back of the MRI subsystem 320 and connected via DAU cable termination blocks 330 to detectors (not shown). Other DAU mounting brackets 340 are shown on the back of the MRI subsystem 320.

While a PET subsystem in the context of a hybrid modality medical imaging system is disclosed herein as an enabling embodiment, the principle of deriving each non-MRI subsystem timing signal to be deployed in the MRI RF cabin from a time base common between the non-MRI subsystem and an MRI subsystem, is applicable when the non-MRI modality is other then PET, and when the non-MRI subsystem is other than an imaging subsystem.

Methods of the technology include methods for timing in a medical imaging system, where the medical imaging system includes an MRI subsystem and a non-MRI subsystem, and where operation of the non-MRI subsystem involves a timing signal within a radio frequency (RF) cabin of the MRI subsystem. In such methods each non-MRI subsystem timing signal operating in the RF cabin is based on a time base common between the MRI subsystem and the non-MRI subsystem. In some implementations the non-MRI subsystem is a medical imaging subsystem. In some of those implementations the non-MRI medical imaging subsystem is a PET subsystem. In some implementations of the technology, each non-MRI subsystem timing signal based on the common time base is created using the same model of equipment used for creating timing signals in the MRI subsystem. In some implementations of the technology at least one stage of the non-MRI subsystem timing signal based on the common time base is created using the same equipment used for creating timing signals in the MRI subsystem.

Systems of the technology include medical imaging systems comprising a magnetic resonance imaging (MRI) subsystem having an RF cabin, and a non-MRI subsystem, the non-MRI subsystem comprising at least one element operable to perform operations involving a timing signal in the RF cabin. In such systems the timing signal is based on a time base common between the MRI subsystem and the non-MRI subsystem. In some of those systems, the non-MRI subsystem is a medical imaging subsystem. In some of those systems the non-MRI medical imaging subsystem is a positron emission tomography (PET) subsystem. Each non-MRI subsystem timing signal based on the common time base can be created using the same model of equipment used for creating tuning signals in the MRI subsystem. At least one stage of the non-MRI subsystem timing signal created from the common time base can be created using the same equipment used for deriving timing signals in the MRI subsystem.

The present technology can take the forms of hardware, software or both hardware and software elements. In some implementations, the technology is implemented in software, which includes but is not limited to firmware, resident software, microcode, a Field Programmable Gate Array (FPGA), graphics processing unit (GPU), or Application-Specific Integrated Circuit (ASIC), etc. In particular, for real-time or near real-time use, an FPGA or GPU implementation would be desirable.

Furthermore, the present technology can take the form of a computer program product comprising program modules accessible from computer-usable or computer-readable medium storing program code for use by or in connection with one or more computers, processors, or instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium (though propagation mediums in and of themselves as signal carriers are not included in the definition of physical computer-readable medium). Examples of a physical computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. Both processors and program code for implementing each as aspect of the technology can be centralized or distributed (or a combination thereof) as known to those skilled in the art.

Figure 4:
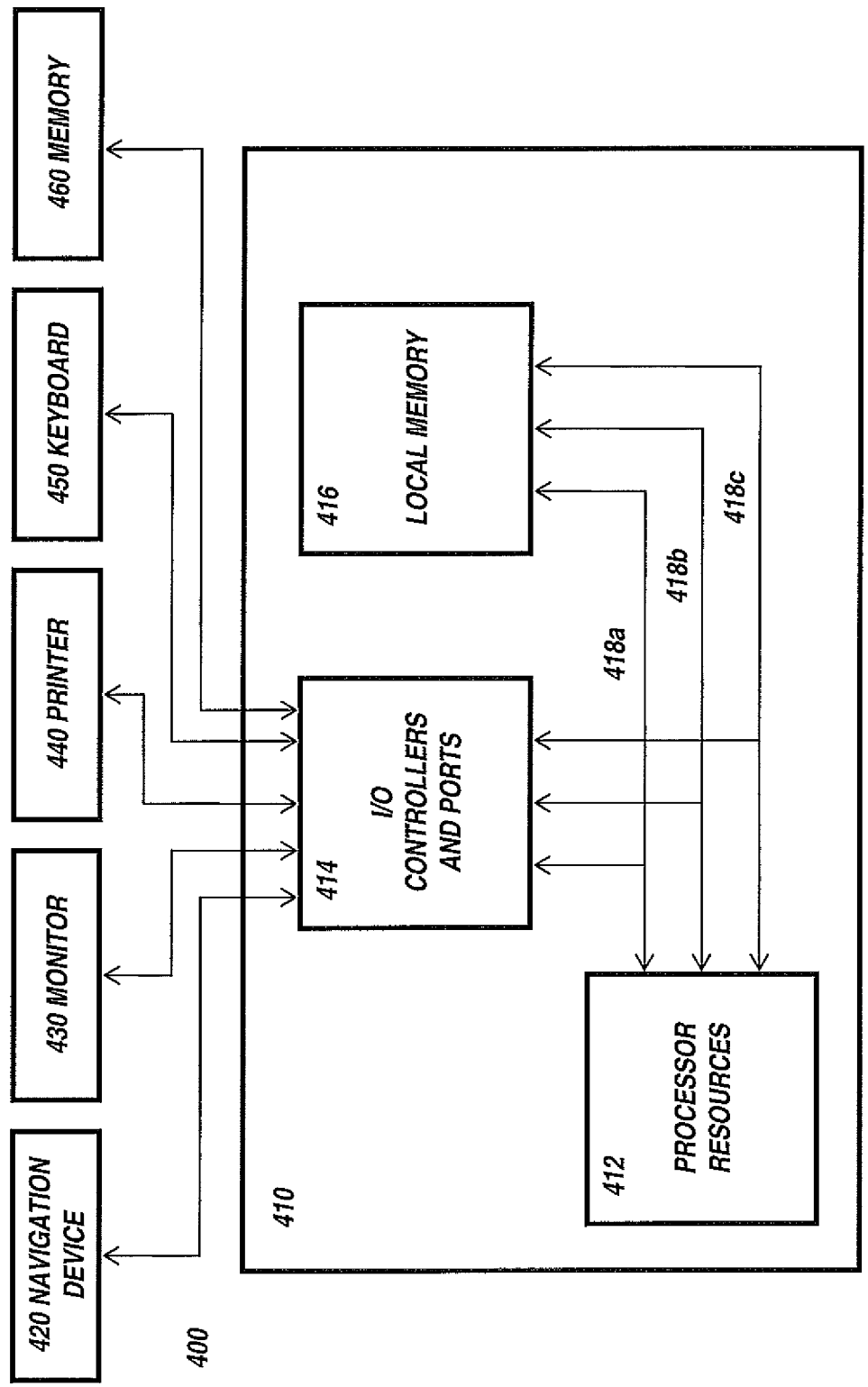
FIG. 4 illustrates a data processing system suitable for storing a computer program product of the present technology.

Referring to FIG. 4, a data processing system (e.g., 400) suitable for storing a computer program product of the present technology and for executing the program code of the computer program product can include at least one processor (e.g., processor resources 412) coupled directly or indirectly to memory elements through a system bus (e.g., 418 comprising data bus 418a, address bus 418b, and control bus 418c). The memory elements can include local memory (e.g., 416) employed during actual execution of the program code, bulk storage (e.g., 460), and cache memories (e.g., including cache memory as part of local memory or integrated into processor resources) that provide temporary storage of at least some program code in order to reduce the number of times code must be retrieved from bulk storage during execution. Input/output or I/O devices (including but not limited to keyboards 450, displays 430, pointing devices 420, etc.) can be coupled to the system either directly or through intervening I/O controllers (e.g., 414). Network adapters can also be coupled to the system to enable the data processing system to become coupled to other data processing systems or remote printers or storage devices through intervening private or public networks. Modems, cable modem and Ethernet cards are just a few of the currently available types of network adapters. Such systems can be centralized or distributed, e.g., in peer-to-peer and client/server configurations. In some implementations, the data processing system is implemented using one or both of FPGAs and ASICs.

The invention claimed is:

1. A method for providing image acquisition timing signals in a multi-modality medical imaging system, the system comprising a magnetic resonance imaging (MRI) subsystem using an MRI timing signal and a non-MRI imaging subsystem, the non-MRI imaging subsystem using a non-MRI timing signal, at least part of the non-MRI imaging subsystem being located within a radio frequency (RF) cabin of the MRI subsystem, the method comprising:
separately deriving, by a processor, said non-MRI imaging subsystem timing signal and said MRI timing signal from a common clock, the non-MRI imaging subsystem timing signal and MRI subsystem timing signal being created by dividing a common time base into a plurality of phase locked signals,
utilizing the common clock between the MRI subsystem and said non-MRI imaging subsystem to perform simultaneous imaging without causing interference between the MRI subsystem and non-MRI imaging subsystem.

2. The method of claim 1 wherein:
the non-MRI imaging subsystem is a medical imaging subsystem.

3. The method of claim 2 wherein:
the non-MRI medical imaging subsystem is a positron emission tomography (PET) subsystem.

4. The method of claim 1 wherein:
each non-MRI imaging subsystem timing signal operable in the RF cabin and based on the common clock is created using the same model of equipment used for creating timing signals in the MRI subsystem.

5. The method of claim 1 wherein:
at least one stage of the non-MRI imaging subsystem timing signal operable in the RF cabin and based on the common clock time base is created using the same equipment used for creating timing signals in the MRI subsystem.

6. The method of claim 1 wherein:
the MRI imaging subsystem is a 3 T subsystem,
the non-MRI subsystem is a positron emission tomography (PET) subsystem comprising at least one data acquisition unit (DAU) in the MRI subsystem RF cabin, the common clock operates at 10 mhz, and
at least one non-MRI imaging subsystem timing signal is 160 mhz.

7. The method of claim 6 wherein:
DAU operating frequencies are at least one of phased-locked and derived from a 160 mhz timing signal.

8. The method of claim 1 further comprising:
distributing the non-MRI imaging subsystem timing signal as sine waves.

9. The method of claim 1 further comprising:
distributing the non-MRI imaging subsystem timing signal via passive splitters.

10. A multi-modality imaging system comprising:
a common clock;
a magnetic resonance imaging (MRI) subsystem operable to perform MRI imaging operations using an MRI timing signal derived from said common clock, the MRI subsystem comprising a radio frequency (RF) cabin; and
a non-MRI imaging subsystem, the non-MRI imaging subsystem comprising a non-MRI image acquisition unit and at least one data processing unit operable to perform non-MRI imaging operations using a non-MRI timing signal in conjunction with data from said non-MRI image acquisition unit, said non-MRI timing signal being derived from said common clock;
wherein: said at least one data processing unit derives said timing signal from said common clock and is housed within the MRI subsystem RF cabin; wherein said data processing unit creates the respective timing signals for each the MRI subsystem and the non-MRI imaging subsystem by dividing a common time base into a plurality of phase locked signals, and utilizing the common clock between the MRI subsystem and said non-MRI imaging subsystem to perform simultaneous imaging without causing interference between the MRI subsystem and non-MRI imaging subsystem.

11. The system of claim 10 wherein:
the non-MRI imaging subsystem is a medical imaging subsystem.

12. The system of claim 11 wherein:
the medical imaging subsystem is a positron emission tomography (PET) subsystem.

13. The system of claim 10, further comprising a plurality of said non-MRI imaging subsystems wherein:
each non-MRI imaging subsystem timing signal is created using the same model of equipment used for creating timing signals in the MRI subsystem.

14. The system of claim 10 wherein said non-MRI imaging timing signal comprises a plurality of stages,
at least one stage of the non-MRI imaging subsystem timing signal being created using the same equipment used for deriving timing signals in the MRI subsystem.

15. The system of claim 10 wherein:
the MRI subsystem is a 3 T subsystem;
the non-MRI imaging subsystem is a positron emission tomography (PET) subsystem comprising at least one data acquisition unit (DAU) in the MRI subsystem RF cabin;
the common clock operates at 10 mhz; and
at least one non-MRI imaging subsystem timing signal is 160 mhz.

16. The system of claim 15 wherein:
DAU operating frequencies are at least one of phased-locked and derived from the 160 mhz timing signal.

17. The system of claim 10, wherein
the non-MRI imaging subsystem timing signal is distributed as sine waves.

18. The system of claim 10, wherein
the non-MRI imaging subsystem timing signal is distributed via passive splitters.

* * * * *